United States Patent [19]

Cadwell et al.

[11] Patent Number: 5,315,478
[45] Date of Patent: May 24, 1994

[54] MEMORY CARD TRAY FOR PORTABLE COMPUTER

[75] Inventors: Peter F. Cadwell, Sunnyvale; Noah L. Anglin, San Jose, both of Calif.

[73] Assignee: Fujitsu Personal Systems, Inc., Santa Clara, Calif.

[21] Appl. No.: 777,454

[22] Filed: Oct. 16, 1991

Related U.S. Application Data

[63] Continuation of Ser. No. 374,409, Jun. 30, 1989, abandoned.

[51] Int. Cl.[5] .............................................. H05K 5/00
[52] U.S. Cl. ......................................... 361/684; 361/727; 439/76; 439/374; 439/378; 439/924
[58] Field of Search .............. 211/41; 235/486, 492, 235/495; 312/331, 333, 334, 337–338; 361/331, 338, 339, 390, 391, 393, 394, 395, 399, 415, 413; 364/708; 369/75.1; 439/64, 76, 296–298, 326, 376, 489, 924, 378, 377, 633

[56] References Cited

U.S. PATENT DOCUMENTS

| | | | |
|---|---|---|---|
| 3,088,054 | 4/1963 | Meyer | 361/338 |
| 4,190,306 | 2/1980 | Litchfield et al. | 312/333 |
| 4,388,671 | 6/1983 | Hall et al. | 361/391 |
| 4,399,487 | 8/1983 | Neumann | 361/391 |
| 4,397,511 | 8/1983 | Clark et al. | 361/392 |
| 4,458,964 | 7/1984 | Hardy | 312/338 |
| 4,754,397 | 6/1988 | Varaiya et al. | 364/708 |
| 4,809,360 | 2/1989 | Kraft | 361/394 |
| 4,821,146 | 4/1989 | Behrens et al. | 361/395 |
| 4,879,635 | 11/1989 | Collins et al. | 361/391 |
| 4,899,254 | 2/1990 | Ferchau et al. | 361/410 |
| 4,941,841 | 7/1990 | Darden et al. | 364/708 |
| 4,977,532 | 12/1990 | Barkowicz et al. | 361/391 |
| 5,055,970 | 10/1991 | Weihs | 361/391 |

FOREIGN PATENT DOCUMENTS

| | | | |
|---|---|---|---|
| 0095784 | 5/1985 | Japan | 361/380 |
| 0173789 | 9/1985 | Japan | 361/380 |

*Primary Examiner*—Gregory D. Thompson
*Attorney, Agent, or Firm*—Skjerven, Morrill, MacPherson, Franklin & Friel

[57] ABSTRACT

A tray for inserting a memory card into a portable computer is described. The tray facilitates complete insertion of the memory card into the computer and optimum electrical interconnection between the memory card and the computer interior. The tray is dimensioned such that it creates a tight seal with the computer housing and provides a coplanar fit with the exterior of the computer housing. No portions of the tray or memory card protrude beyond the computer housing, thereby improving the durability, maneuverability, and compactness of the portable computer. A stop mechanism restrains the tray within the housing when the tray is opened. A memory card can easily be placed thereinto or removed therefrom when the tray is opened and yet the tray does not become separated from the computer and lost.

4 Claims, 8 Drawing Sheets

MEMORY CARD TRAY FOR PORTABLE COMPUTER

This application is a continuation of application Ser. No. 07/374,409, filed Jun. 30, 1989, now abandoned.

BACKGROUND OF THE INVENTION

This invention relates to a means for providing memory for a portable computer, in particular memory which uses very low power and occupies very small space.

The most common conventional method for providing memory in a stand-alone computer is using magnetic disk drives. Nonvolatile memory on diskettes and their concurrent disk drives tend to require relatively large computer hardware and significant power. This method of memory storage and access is less desirable in portable computers. Consequently, volatile memory options have been developed which require very low power and can be utilized effectively by leaving the power to the computer continuously on. Volatile and nonvolatile memory in the form of random access memory (RAM), one time programmable read only memory (OTPROM), and read only memory (ROM) cards are now available to meet the demand for low power memory options.

According to a means for inserting a memory card within a computer housing used by Casio in their Pocketword PW-1000 hand held computer, the card itself slides into an opening in the housing usually protected by a cover. The cover is fully removable and must be fully removed to insert the memory card. When the memory card is inserted, the cover can be easily misplaced. Without a cover, dirt and debris can accumulate inside the computer's internal structure and cause malfunctions over time. Furthermore, the memory card does not slide into the opening completely. A portion of the card must protrude out beyond the edge of the computer housing to facilitate removal. This conventional arrangement restrains the maneuverability, decreases the compactness of the portable computer and jeopardizes the proper functioning of the equipment over time. Since the trend in portable computer technology is miniaturization, maneuverability and compactness, this conventional computer design becomes less suitable to that end.

SUMMARY OF THE INVENTION

It is therefore an object of this invention to provide a means for holding a memory card which can be completely inserted into a computer housing such that the memory card fits tightly therein and does not protrude beyond the computer's exterior housing wall. According to this invention, a tray is provided for holding and fully inserting a memory card into a computer housing. The memory card tray cannot easily be fully removed and thereby lost, but the open tray allows for easy access to the memory card itself Also, the memory card tray achieves good contact between the memory card and the electrical interconnections inside the computer. The tray aligns the memory card with an associated computer connector located inside the computer, and it eliminates rattling associated with transporting the computer. These features improve the durability, reliability, compactness, and maneuverability of the portable computer.

The memory card tray is of unitary construction made from a material having electrically insulative characteristics, preferably a moldable plastic such as Lexan ® polycarbonate or ABS plastic (acrylonitrilebutadienestyrene) The tray comprises a flat base with vertically projecting stops integrally formed on the base. The tray has two side walls integrally formed and extending vertically up from the base. Each side wall may contain a cut out which exposes a thickness of the memory card when the memory card is placed in the tray. Also, a front wall is integrally formed and extends vertically up from the base, the exterior of the front wall being dimensioned to fit flush with the exterior of the computer housing when the tray is fully inserted. The memory card has a socket along one edge and this edge is oriented to the back of the tray. The tray holds the memory card in position as both are inserted, back end first, into the computer. The socket mates with and is received by a plug mounted in the computer housing as the tray is fully inserted. This plug preferably has a vertical thickness no greater than that of the memory card, so that the plug does not cause an increase in thickness of the housing beyond the thickness needed to accommodate the memory card. The plug and socket preferably include corresponding means for preventing the card from being inserted incorrectly. A series of recessed serrations on the outside top of the tray base provide frictional contact for sliding the tray in and out of the computer housing. The memory card tray may also contain one or more recesses on the inside top of the base into each of which a spring mechanism is inserted. The spring mechanism facilitates improved electrical contact between the memory card and the socket when the tray is fully inserted into the computer housing. Also, the spring mechanism eliminates any rattling associated with transporting the computer. When the tray is opened, the spring mechanism facilitates lifting the memory card from the tray for easy removal. The tray may have one or more additional features, i.e., spring mechanisms, stop clips or raised stops, which prevent the tray from being completely removed from the housing and lost.

It is preferable that an enabling electrical means be provided to indicate to the computer that the memory card has been inserted or removed. The computer preferably includes means for recognizing that the memory card is being removed before data and control pins are disconnected. With this invention, a user may open the memory card drawer without the subsequent disconnection of pins from their sockets causing any loss of data from the memory card. When the memory card socket connectors are beginning to be disconnected from the corresponding pins, there may be combinations of partial connections which cause undesirable voltage states in the memory card or computer and which may result in loss of memory card data or undesirable electrical results in the computer. To prevent undesirable electrical response the enabling means is disenabled before any pins have been removed from the socket and electrically disconnected.

One way this enabling means can be implemented is to provide one or more conductive extensions at the back of the memory card tray which serve as a shorting bar between conductive side rails in a slot which receives the extension or extensions. The side rails are connected to a pair of lines recognized by the computer as indicating that a memory card is present. The side rails and extensions are sized with respect to the pins and socket such that as the memory card is inserted into the computer by closing the memory card tray, the pins and socket make electrical contact before the extension or extensions make electrical contact with the side rails, and when the memory card is removed, the extensions electrically disconnect from the side rails before the pins and sockets electrically disconnect.

Another way this enabling means can be implemented is to use an enabling feature within the memory card, in which certain socket contacts indicate to the memory card that the card has been connected to a computer. To implement this method, those pins which correspond to the socket contacts which enable the card are made shorter than the other pins by an amount sufficient to assure that the remainder of the pins have made contact before the short pins have made contact, and remain connected until after the short pins have been disconnected.

DETAILED DESCRIPTION OF THE INVENTION

Figure 1:
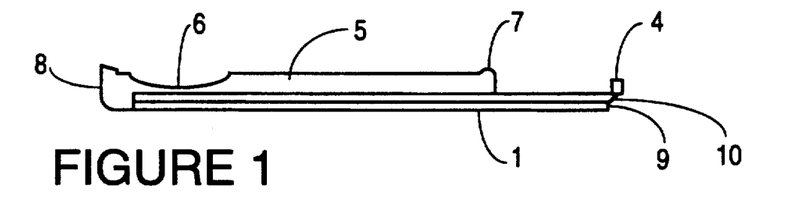
FIG. 1 is a side view of the memory card tray illustrating a first embodiment of this invention.
Figure 2:
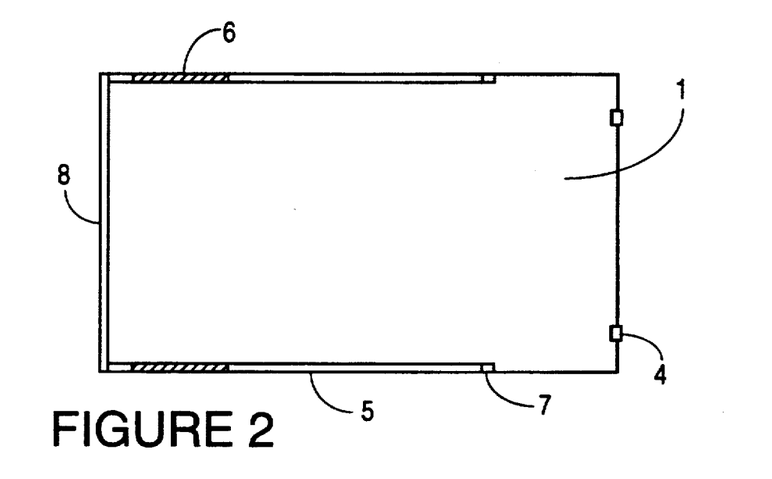
FIG. 2 is an inside top view illustrating the first embodiment of this invention as in FIG. 1.
Figure 7:
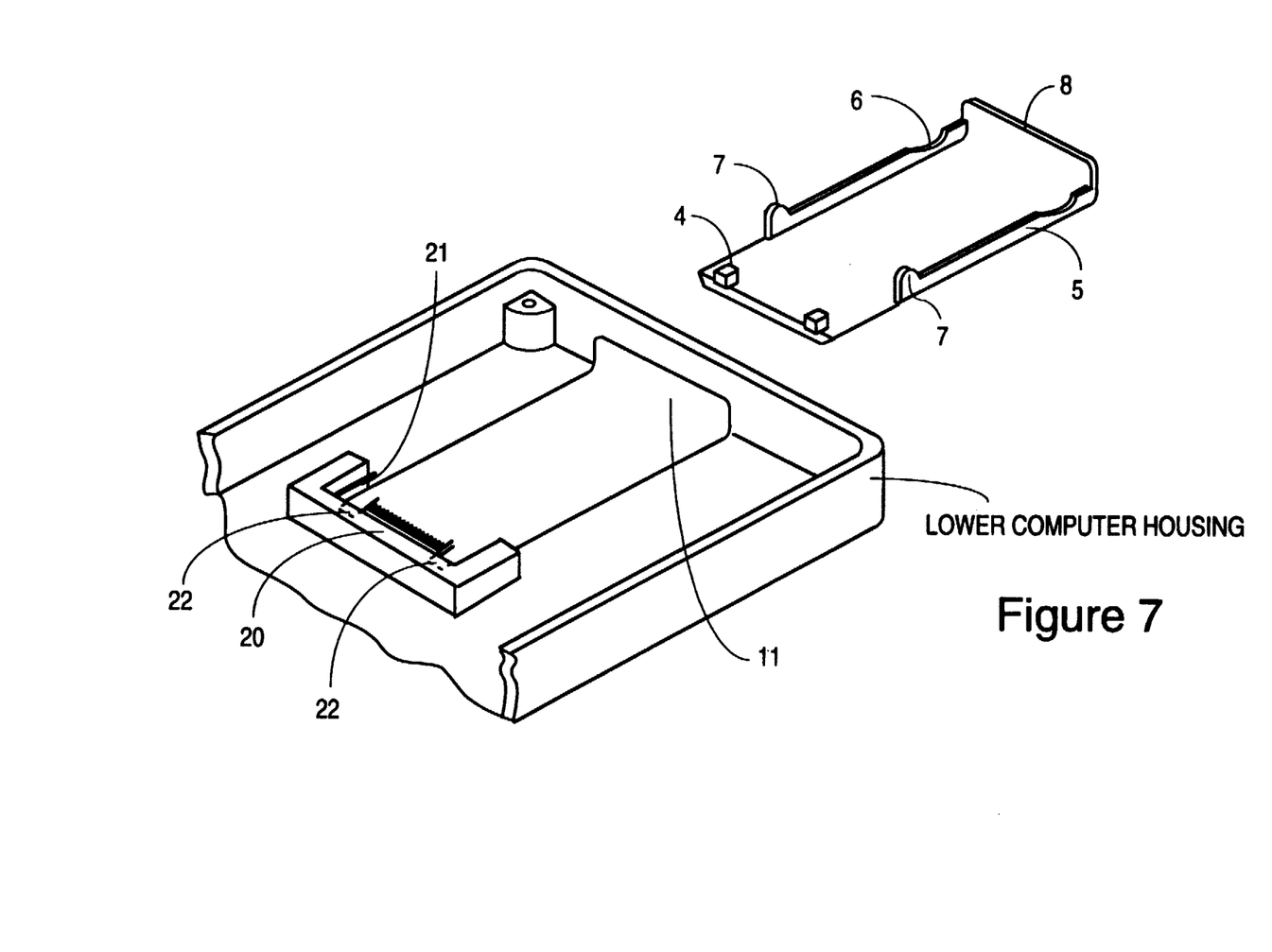
FIG. 7 is an inside top view illustrating the first embodiment of this invention with a lower computer housing.
Figure 8:
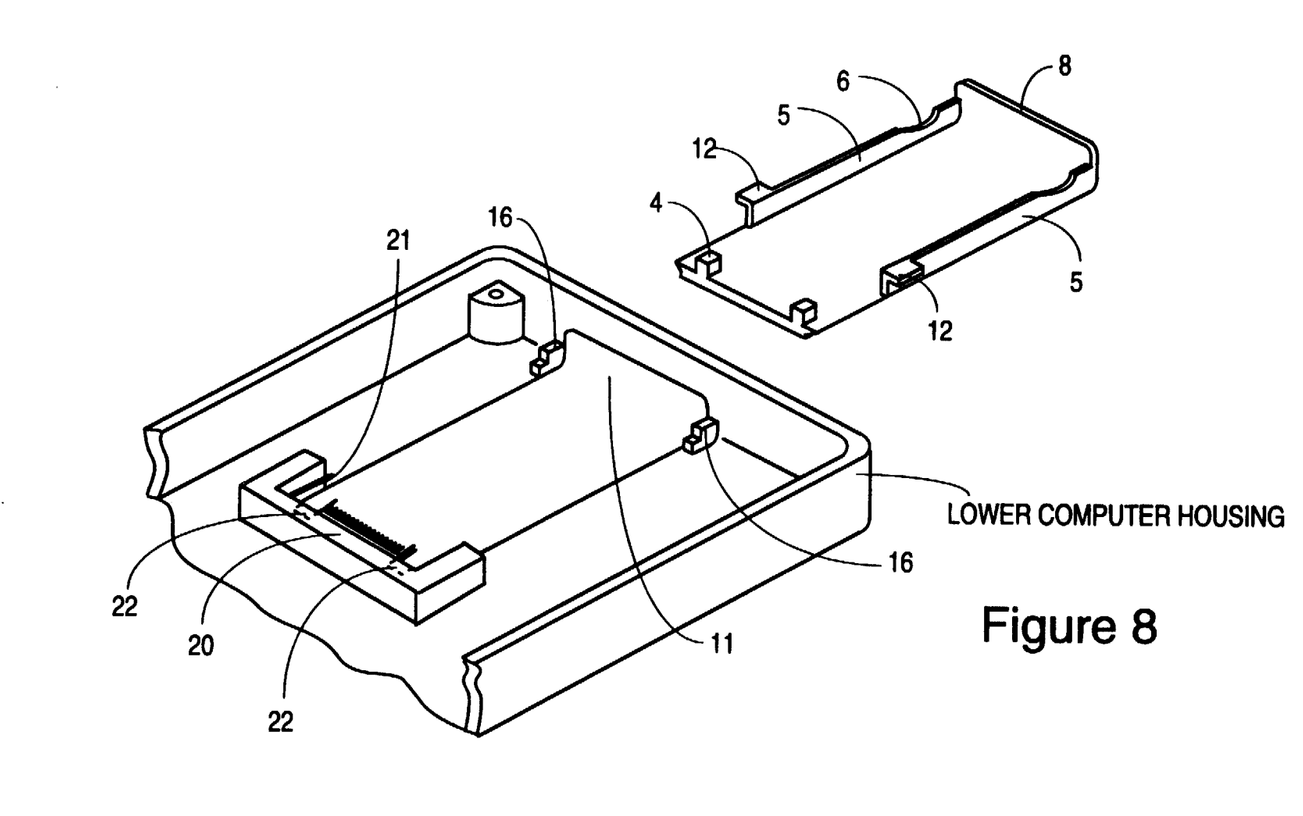
FIG. 8 is an inside top view illustrating an embodiment of this invention with a lower computer housing.
Figure 10:
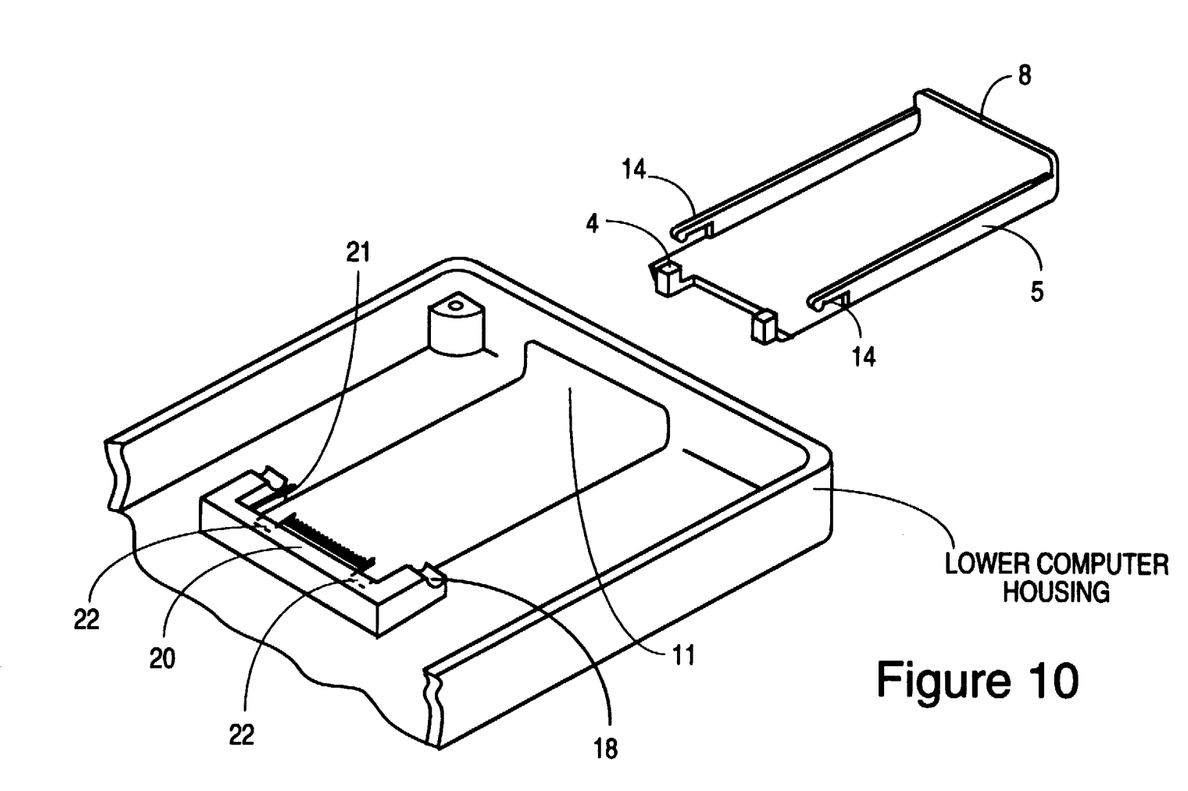
FIG. 10 is an inside top view illustrating an embodiment of this invention with a lower computer housing.
Figure 11:
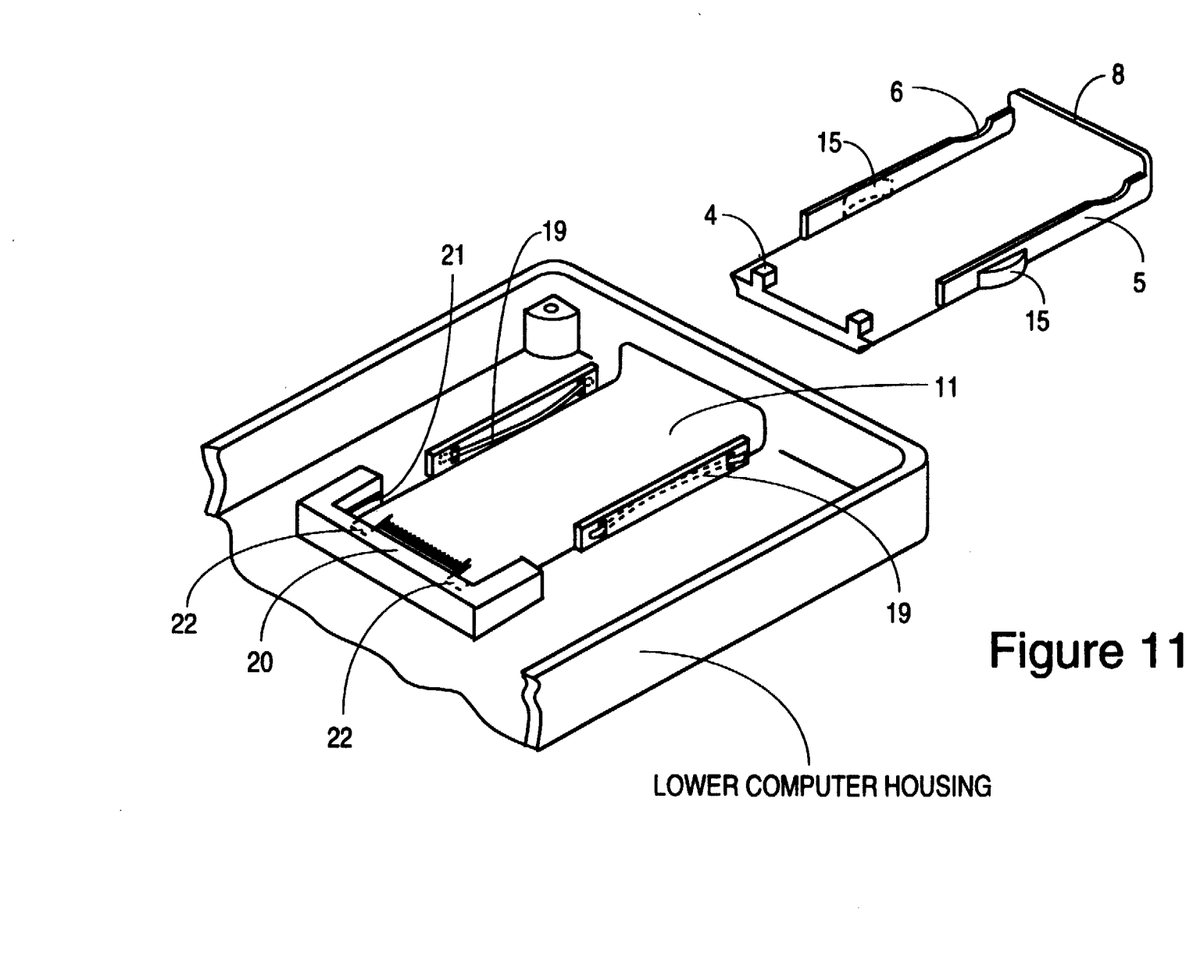
FIG. 11 is an outside side view illustrating an embodiment of this invention with a lower computer housing.

FIGS. 1 and 2 illustrate a first embodiment of the memory card tray. As shown in FIGS. 1 and 2, the tray is constructed with a flat base 1, the top surface of which supports a memory card (not shown). The top surface of the base 1 has a vertically extending rear stop 4, dimensionally sized and positioned and integrally formed thereon at the back of the tray to provide stop points for positioning the memory card in the tray. The tray has side walls 5 integrally formed with base 1 extending vertically up on either side of base 1 along a length thereof. In a preferred embodiment, the side walls 5 have a cut out 6 near the front of the tray exposing an area of the memory card's thickness for easy removal of the memory card. The side walls 5 further may have stop mechanisms 7 added at the ends thereof opposite the front end of the tray to prevent complete and easy removal of the tray from the computer housing. The stop mechanisms may extend differently relative to the side walls 5 depending on the embodiment, as illustrated in FIGS. 7, 8, 10 and 11. In FIGS. 1 and 7, a first embodiment, the stop mechanisms 7 extend up vertically from side walls 5. The stop mechanisms contact the inside wall above slot 11 to catch the tray in an open position by its stop mechanisms 7. FIG. 8 illustrates an embodiment, wherein stop mechanisms 12 extend horizontally from the side walls 5. The computer housing has catch mechanisms 16 just inside the computer housing near slot 11 which catch the tray at a specified opened position by its stop mechanisms 12. In FIG. 10, stop clips 14 which extend lengthwise back from the side walls 5 are provided to latch the tray into a closed position. These stop clips 14 clip on to associated catch points 18 within the computer housing. FIG. 11 illustrates an embodiment having an alternative spring mechanism design wherein springs 15 protrude laterally out from the side walls 5. The springs provide tension against the associated internal wall catch mechanisms 19 of the computer housing when the tray is fully inserted into the computer housing. When the tray is opened to a specified amount, the stop springs 15 are released from the catch mechanisms 19 inside the computer housing.

The memory card has a socket along one edge and this edge is oriented to the back of the tray against rear stops 4. When the tray is fully inserted into the computer housing, the memory card socket mates with and makes electrical contact to plug 20 attached to the computer housing, as illustrated in FIG. 7 (memory card not shown) Plug 20 includes guide 21 located at one end of its length. Guide 21 mates with a corresponding slot on the memory card. No corresponding guide and slot are provided at the other end of plug 20 and the memory card, thus it is not possible to insert the memory card in the wrong orientation. Plug 20 also has guide members 22 which receive rear stops 4 and cooperatively provide fool-proof alignment of the memory card with plug 20. Plug 20 preferably has an overall vertical height no greater than that of the memory card. Plug 20 is preferably bonded to the lower surface of a printed circuit board (not shown) to which contacts leading from plug 20 are connected.

This printed circuit board is described in detail in commonly assigned copending application Ser. No. 07/375,721, entitled PORTABLE LOW POWER COMPUTER", incorporated herein by reference.

The plug and socket preferably include means for enabling the memory card to be used by the computer only after all the connecting pins have been connected. In a first embodiment, stops 4 are covered with a conductive outer surface or are made of a conductive material. Coordinating with these stops, guide members 22 include conductive side rails applied to side surfaces of guide members 22 which are shorted together by the insertion of stops 4, indicating that the memory card is in place. Pins 25-$l$ through 25-$k$ are sized such that they make contact with corresponding socket connectors (not shown) before the conductive portion of stops 4 makes contact with the conductive side rails in guide members 22.

In a second embodiment, one or preferably two of pins 25-$l$ through 25-$k$ which cooperate with those socket connectors which are used by the memory card (not shown) to enable the memory card, or used by conductive lines in the computer to provide an enable signal to the memory card are made shorter than the rest of pins 25-*l* through 25-*k* so that the rest of the pins will make contact with their corresponding socket before the enable pins make contact.

As the memory card tray is opened and the memory card removed from the computer, these enabling devices, either the pins or the conductive stops, disconnect before the pins used for control and data signals disconnect.

Figure 9A:
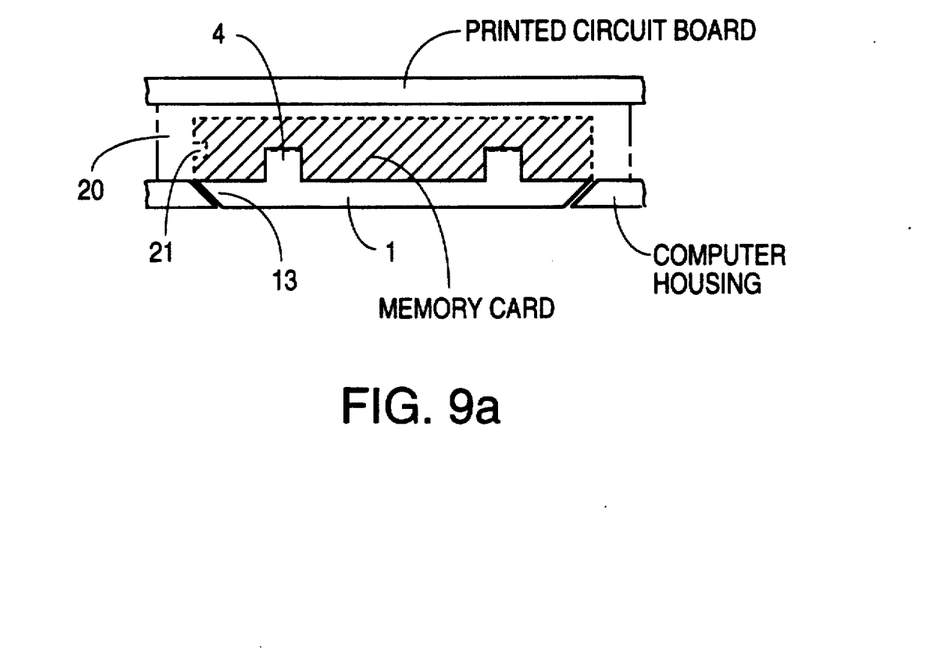
FIG. 9a is an alternative outside bottom edge view illustrating an embodiment of this invention.
Figure 9B:
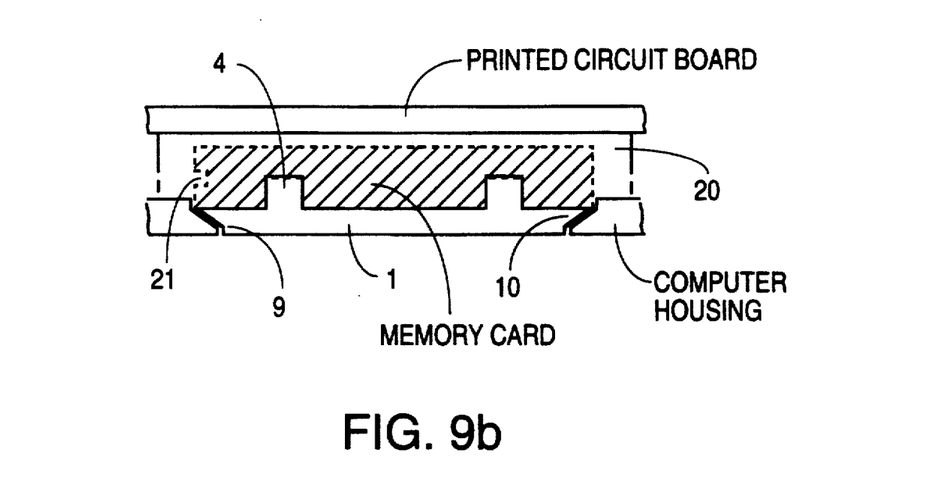
FIG. 9b is an outside bottom view illustrating the first embodiment of this invention.

The front end of the tray has a wall 8 formed integrally with base 1 and side walls 5. The front wall 8 is dimensionally sized and shaped so that the exterior of the front wall is flush with the exterior of a computer housing when the tray is inserted completely thereinto, as illustrated in FIG. 6b. As illustrated in FIG. 9b, the outside bottom edges of the tray along the sides and back of the base may have both a sliding edge 9 extending vertically thereinto for a portion of the base thickness and a load carrying edge 10 extending diagonally out from sliding edge 9, meeting with the outside of side walls 5. Alternatively, the embodiment illustrated in FIG. 9a incorporates outside bottom edges of the tray having a single slanted edge 13 which both carries the vertical load and provides a horizontal guide. These dimensional nuances facilitate a tight seal when the tray is inserted completely into its computer housing slot 11, as illustrated in FIG. 6b, and smooth sliding movement of the tray.

Figure 3:
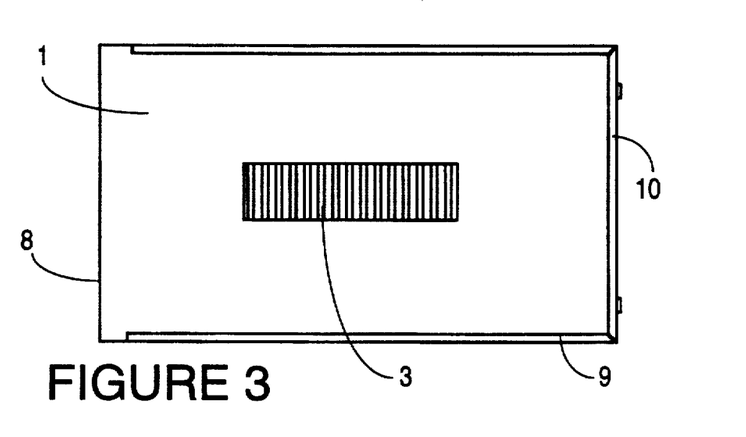
FIG. 3 illustrates an outside bottom view of an embodiment of this invention.

FIG. 3 illustrates an outside bottom view of the tray. On the bottom surface of the flat base 1, a series of recessed serrations 3 are provided for frictional contact when sliding the tray without the need for a protrusion such as a handle. The recessed serrations may extend along the full length of the tray or part way, as shown.

Figure 4:
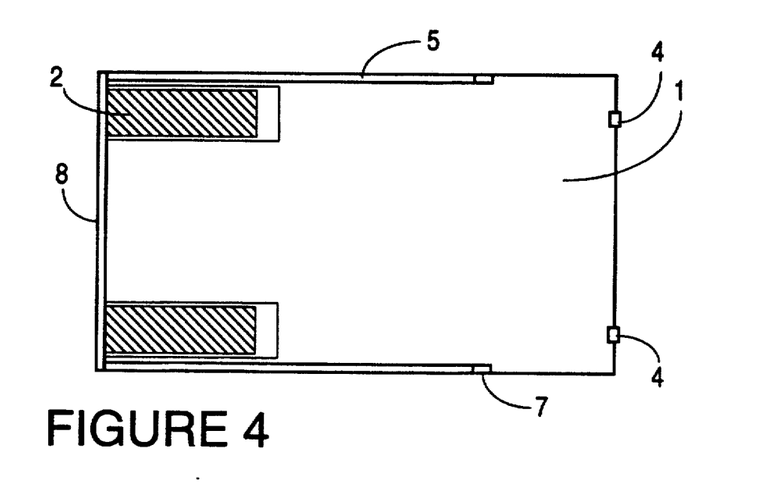
FIG. 4 is an inside top view illustrating a second embodiment of this invention.

FIG. 4 illustrates an inside top view of the memory card tray in a second embodiment. The tray contains all the features of the first embodiment, illustrated in FIGS. 1 and 2, except the cutouts 6. Instead of cutouts 6 in the side walls 5, this embodiment includes a pair of spring mechanisms 2 embedded into the inside top of the base 1. Each spring mechanism 2 consists of a thin strip of curved plastic which can be compressed by the inserted memory card when the tray is closed. Each spring mechanism 2 provides tension to the memory card (not shown) when the memory card is inserted into the computer housing and facilitates card removal when the tray is opened. If the memory card were to fit loosely when inserted into slot 11 in the computer housing, rattling due to movement of the portable computer would cause loose electrical interconnections and damage to the memory card over time. The spring mechanism 2 eliminates the rattling of the memory card caused by a loose fit and eliminates the potential for damage to the memory card when the portable computer is moved around. Nevertheless, the spring mechanism 2 requires an added fabrication step, so that this disadvantage must be weighed with the advantages listed above. Alternatively, the first embodiment, illustrated in FIGS. 1 and 2, relies on the accurate fit of the memory card to eliminate the rattling and to maintain electrical contact.

Figure 5:
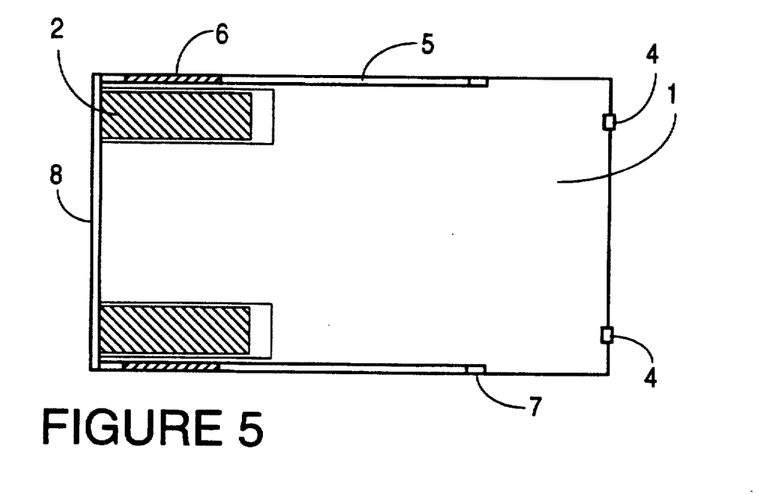
FIG. 5 is an inside top view illustrating a third embodiment of the present invention.

FIG. 5 is an inside top view of the memory card tray in a third embodiment. This embodiment of the memory card tray includes all of the features from FIGS. 1, 2, and 4. Consequently, this tray comprises both a spring mechanism 2 providing tension to the memory card when the memory card is inserted into the computer housing and cutouts 6 which provide access to the sides of the memory card for easy removal and placement into the tray. In all embodiments, the positioning of the memory card in the tray and the insertion of the tray into slot 11 provide alignment of the memory card with the electrical interconnections of the computer for foolproof operation after insertion. Moreover, all embodiments are molded from an electrically insulating material, preferably Lexan or ABS plastic, into a unitary construction. Those embodiments incorporating spring mechanisms have additional pieces of an electrically insulating plastic included therein and require some assembly.

Figure 6A:
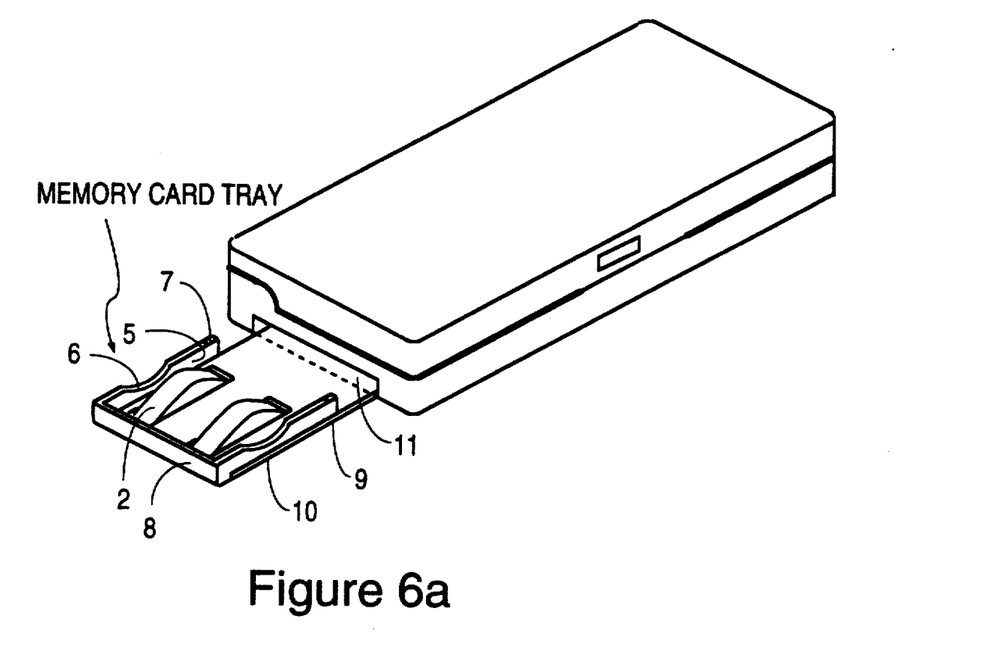
FIG. 6a illustrates the memory card tray in an opened position in a portable computer housing.
Figure 6B:
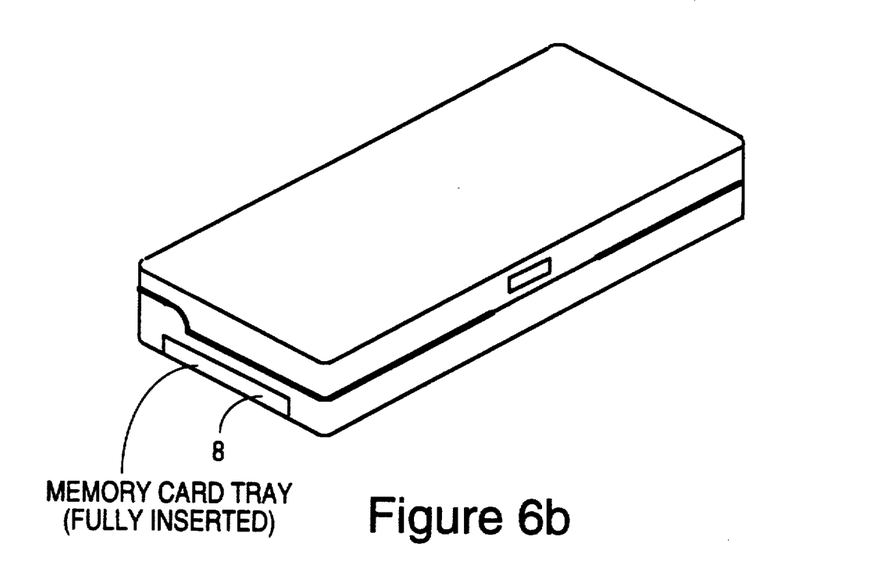
FIG. 6b illustrates the memory card tray in a fully closed position, within a portable computer housing.

FIG. 6a shows the memory card tray associated with a representative portable computer housing. The memory card tray having all of the features described above, as illustrated in FIG. 5, is partially inserted in the computer housing slot 11. FIG. 6b illustrates the memory card tray in a fully inserted position depicting a flush fit with the computer housing exterior.

While the invention has been described in connection with several exemplary embodiments, it will be understood that many modifications will be apparent to those of ordinary skill in the art. Other modifications or variations might include two memory card trays instead of one; trays inserted at either end along the length of the portable computer or trays inserted from the sides across the width of the portable computer; one tray or both trays might be located in the upper housing rather than the lower housing of the portable computer; the trays might be oriented at different angles wherein one might be inserted from the end and the other from the side of the computer housing; the memory card and the tray may be spring loaded into the portable computer housing using an alternative spring mechanism; the tray could be designed to slide and carry the memory card in alternative ways; and different stop mechanisms and associated catch mechanisms as well as eliminating the stop mechanism altogether are all examples of the potential modifications that are possible. This application is intended to cover any adaptations or variations of this invention.

What is claimed is:

1. A structure comprising:
    a memory card having a socket comprising a plurality of socket connectors;
    means for inserting and holding said memory card in a computer housing,
    a computer housing comprising a plug from which extend a plurality of plug pins;
    a computer having circuitry connected to said plug pins; and
    means for enabling said computer to access said memory card after said plurality of plug pins are connected to respective ones of said socket connectors, wherein said means for enabling said computer comprises a conductive stop at a back end of said means for inserting and holding and a conductive guide member on said plug, arranged such that said plurality of plug pins are connected to respective socket connectors before said conductive stop contacts said conductive guide member.

2. An assembly comprising:
    a computer having a housing, the housing comprising a plug;
    a memory card having a socket means for making an electrical connection between the housing and the memory card; and
    a tray means, which is insertable into the housing, the memory card being insertable into the tray, for inserting and holding the memory card in the housing, wherein the plug is disposed on the housing, the socket means is disposed on the memory card, and the tray means is shaped so that the socket means makes electrical contact with the plug when the tray means is inserted into the housing, wherein the tray means comprises:

a base;

a pair of side walls coupled to the base and being parallel to each other;

a front wall coupled to a front end of the base, the front end of the base being opposite a back end of the base; and a card insertion stop formed at the back end of the base, the plug having a guide for receiving the card insertion stop.

3. An assembly comprising:

a computer having a housing, the housing comprising a plug;

a memory card having a socket means for making an electrical connection between the housing and the memory card; and a tray mean, which is insertable into the housing, the memory card being insertable into the tray means, for inserting and holding the memory card in the housing, wherein the plug is disposed on the housing, the socket means is disposed on the memory card, and the tray means is shaped so that the socket means makes electrical contact with the plug when the tray means is inserted into the housing, the tray means comprising:

a base;

a pair of side walls coupled to the base and being parallel to each other;

a front wall coupled to a front end of the base, the front end of the base being opposite a back end of the base; and a card insertion stop formed at the back end of the base, the plug having a guide for receiving the card insertion stop, wherein the plug includes a sliding guide which cooperates with a corresponding guide in the memory card for aligning the memory card and which prevents incorrect orientation of the memory card.

4. An assembly comprising:

a computer having a housing, the housing comprises a plug;

a memory card having a socket means for making a plug;

a memory card having a socket means for making an electrical connection between the housing and the memory card; and a tray means, which is insertable into the housing, the memory card being insertable into the tray means, for inserting and holding the memory card in the housing, wherein the plug is disposed on the housing, the socket means is disposed on the memory card, and the tray means is shaped so that the socket means makes electrical contact with the plug when the tray means is inserted into the housing, the tray means comprising:

a base;

a pair of side walls coupled to the base and being parallel to each other;

a front wall coupled to a front end of the base, the front end of the base being opposite a back end of the base; and a card insertion stop formed at the back end of the base, the plug having a guide for receiving the card insertion stop, wherein the computer includes a printed circuit board, and wherein the plug is fixedly attached to the printed circuit board and has a plurality of pin means for making electrical connection to the socket means of the memory card, the pin means extending in a direction approximately parallel to the printed circuit board, and the plug having a vertical thickness not appreciably greater than a vertical thickness of the memory card, whereby the plug does not increase a thickness required by the computer for accommodating the memory card.

* * * * *

UNITED STATES PATENT AND TRADEMARK OFFICE
CERTIFICATE OF CORRECTION

PATENT NO.   :   5,315,478
DATED        :   May 24, 1994
INVENTOR(S)  :   Peter F. Cadwell and Noah L. Anglin It is certified that error appears in the above-identified patent and that said Letters Patent is hereby corrected as shown below:

Col. 2, line 5, delete "butadienestyrene" and insert --butadiene-styrene--;

Col. 7, line 23, (Claim 3) delete "mean" and insert --means--;

Col. 8, line 4, (Claim 4) delete "comprises" and insert --comprising--;

Col. 8, lines 6 and 7, (Claim 4) delete "a memory card having a socket means for making a plug;".

Signed and Sealed this

Fourteenth Day of March, 1995

BRUCE LEHMAN

*Attest:*

*Attesting Officer*     *Commissioner of Patents and Trademarks*